(12) United States Patent
Lepley et al.

(10) Patent No.: US 11,112,810 B2
(45) Date of Patent: Sep. 7, 2021

(54) ANALOG CONTROL LOOP WITH DIGITAL FEEDBACK

(71) Applicant: HOERBIGER KOMPRESSORTECHNIK HOLDING GMBH, Vienna (AT)

(72) Inventors: Joseph M. Lepley, Girard, OH (US); Steven B. Pirko, Lake Milton, OH (US)

(73) Assignee: Hoerbiger Wien GmbH, Vienna (AT)

( * ) Notice: Subject to any disclaimer, the term of this patent is extended or adjusted under 35 U.S.C. 154(b) by 0 days.

(21) Appl. No.: 15/924,735

(22) Filed: Mar. 19, 2018

(65) Prior Publication Data

US 2019/0286177 A1 Sep. 19, 2019

(51) Int. Cl.
*G05F 1/12* (2006.01)
*G01R 19/10* (2006.01)
(Continued)

(52) U.S. Cl.
CPC .............. *G05F 1/12* (2013.01); *G01R 19/10* (2013.01); *G01R 19/25* (2013.01); *G01R 33/07* (2013.01); *G05F 1/10* (2013.01)

(58) Field of Classification Search
CPC ............ H02M 3/02; H02M 3/04; H02M 3/10; H02M 3/145; H02M 3/155; H02M 3/156; H02M 3/157; H02M 3/1588; H02M 2001/0003; H02M 2001/0009; H02M 2001/0012; H02M 2001/0016; H02M 2001/0025; H02M 2003/1555; H02M 2003/1566; H02M 1/08; H02M 1/14; H02M 1/143; H02M 1/15; H02M 3/1563;
(Continued)

(56) References Cited

U.S. PATENT DOCUMENTS 3,691,405 A 9/1972 Kendell
4,980,793 A 12/1990 Glowczewski et al.
(Continued)

FOREIGN PATENT DOCUMENTS

EP 0449543 3/1996

OTHER PUBLICATIONS

Narcisse, "Digital Feedback Control", Department of Mathematical Information Technology, University of Jyväskylä Finland, Nov. 22, 2012.

*Primary Examiner* — Thienvu V Tran
*Assistant Examiner* — Carlos O Rivera-Perez
(74) *Attorney, Agent, or Firm* — Fay Sharpe LLP

(57) ABSTRACT

A circuit for controlling current flow to an associated inductive load is provided. The circuit includes a switching element having an open state and a closed state that intermittently connects an associated power supply to the inductive load when the switching element is in the closed state, a switch driver that generates a switch drive signal provided to a control element of the switch that controls the state of the switch to be the open state or the close state based on a desired load current set point and a feedback signal, a current sensor that measures a current flowing through the switching element and the load and generates a sensed current signal, and a summing circuit that adds a representation of the sensed current signal and a supplemental signal comprising a representation of the switch drive signal to generate the feedback signal.

16 Claims, 3 Drawing Sheets

(51) Int. Cl.
*G01R 19/25* (2006.01)
*G01R 33/07* (2006.01)
*G05F 1/10* (2006.01)

(58) Field of Classification Search
CPC . H02M 3/158; H02M 2001/0022; G05F 1/10; G05F 1/12; G05F 1/13; G01R 19/00; G01R 19/10; G01R 19/25; G01R 19/255; G01R 33/07; G01R 33/072; G01R 33/077; G01R 33/075
USPC ........ 323/205–211, 222–226, 234, 271–275, 323/280, 282–286, 299, 301–303, 351; 363/74–80, 89, 90, 123, 124; 327/306, 327/307; 361/160
See application file for complete search history.

(56) References Cited

U.S. PATENT DOCUMENTS

| | | | |
|---|---|---|---|
| 5,442,290 A | 8/1995 | Crooks | |
| 5,703,750 A * | 12/1997 | Kim | G05D 16/2022 361/187 |
| 5,969,514 A | 10/1999 | Merrill | |
| 6,208,497 B1 | 3/2001 | Seale et al. | |
| 6,268,716 B1 | 7/2001 | Burstein et al. | |
| 6,972,969 B1 | 12/2005 | Shteynberg et al. | |
| 6,977,492 B2 | 12/2005 | Sutardja et al. | |
| 7,319,312 B2 | 1/2008 | Leung et al. | |
| 7,324,354 B2 | 1/2008 | Joshi et al. | |
| 7,417,877 B2 | 8/2008 | Leung et al. | |
| 7,502,697 B2 | 3/2009 | Holmquist et al. | |
| 7,570,035 B2 | 8/2009 | Kleveland | |
| 7,903,008 B2 | 3/2011 | Regier | |
| 7,906,949 B1 | 3/2011 | Sutardja et al. | |
| 8,653,840 B2 | 2/2014 | Regier et al. | |
| 8,797,025 B2 | 8/2014 | Regier et al. | |
| 8,816,661 B2 | 8/2014 | Candage et al. | |
| 9,450,628 B2 | 9/2016 | Hammerschmidt | |
| 2006/0083037 A1 | 4/2006 | Leung et al. | |
| 2006/0172783 A1 | 8/2006 | Leung et al. | |
| 2008/0169798 A1* | 7/2008 | Williams | G05F 5/00 323/299 |
| 2009/0134859 A1* | 5/2009 | Shiroyama | H02M 3/33507 323/282 |
| 2013/0207625 A1 | 8/2013 | Futamura | |
| 2013/0328534 A1* | 12/2013 | Hsieh | G05F 3/02 323/271 |
| 2014/0246478 A1 | 9/2014 | Baber et al. | |
| 2018/0062509 A1 | 3/2018 | Duong et al. | |

\* cited by examiner

ANALOG CONTROL LOOP WITH DIGITAL FEEDBACK

BACKGROUND

The present exemplary embodiment relates to closed loop control based upon an analog control circuit. It finds particular application in conjunction with inductive loads such as solenoid valves, and will be described with particular reference thereto. However, it is to be appreciated that the present exemplary embodiment is also amenable to other like applications.

It is known that the task of using a single set point analog control circuit to control the load current to an output device using a Hall effect current sensor is difficult. While current Hall effect technology has its advantages, the typical devices have response time limitations. For example, Hall effect current sensors generally have a bandwidth of 80 to 100 Kilohertz and a response time of 5 to 10 microseconds. When controlling current flow to a low inductance load, for example, the output current can exceed the intended control set point value before the Hall effect current sensor output can reach the proper value. As a result, the control circuit cannot properly respond when a large overshoot of the controlled current occurs.

Thus, there is a need for a solution to the problem of closed loop control based upon an analog control circuit using an analog measurement technique that is slower in response to a parametric change than what is needed for control under the worst case conditions.

BRIEF DESCRIPTION

Various details of the present disclosure are hereinafter summarized to provide a basic understanding. This summary is not an extensive overview of the disclosure and is intended neither to identify certain elements of the disclosure, nor to delineate the scope thereof. Rather, the primary purpose of the summary is to present certain concepts of the disclosure in a simplified form prior to the more detailed description that is presented hereinafter.

By using feedback from a signal representing the OFF/ON condition of an output switch, an accelerator function can be added to the measured analog output of the current sensor, which allows the severity of the overshoot current to be controlled. Since for any given output load there is a load response based upon its physical nature, the value of the acceleration (or supplemental) signal needed for acceptable response can be easily determined. More particularly, the exemplary embodiment includes supplementing the analog control loop with a digital feedback based, for example, upon the state of the controller's output switch, i.e., OFF or ON, and the relationship between the switch state and the measured input parameter of the control. No added analog measurements or complex control circuits are needed.

In one embodiment, a circuit for controlling current flow to an associated inductive load is provided. The circuit includes a switching element having an open state and a closed state that intermittently connects an associated power supply to the inductive load when the switching element is in the closed state, a switch driver that generates a switch drive signal provided to a control element of the switch that controls the state of the switch to be the open state or the close state based on a desired load current set point and a feedback signal, a current sensor that measures a current flowing through the switching element and the load and generates a sensed current signal, and a summing circuit that adds a representation of the sensed current signal and a representation of the switch drive signal to generate the feedback signal.

In another embodiment, a method of controlling current flow to an associated inductive load is provided. The method includes via a switching element having an open state and a closed state, intermittently connecting an associated power supply to the inductive load when the switching element is in the closed state; via a switch driver, generating a switch drive signal provided to a control element of the switch that controls the state of the switch to be the open state or the close state based on a desired load current set point and a feedback signal; via a current sensor, measuring a current flowing through the switching element and the load and generates a sensed current signal; via a summing circuit, adding a representation of the sensed current signal and a representation of the switch drive signal to generate the feedback signal.

Optionally, and in accordance with any one or all of the previous embodiments, the supplemental signal is adjusted relative to the output ON time.

Optionally, and in accordance with any one or all of the previous embodiments, the supplemental signal is a constant.

Optionally, and in accordance with any one or all of the previous embodiments, the supplemental signal changes over time over the course of a single switch closure.

Optionally, and in accordance with any one or all of the previous embodiments, the inductive load is a solenoid valve and/or the current sensor is a Hall effect sensor.

Further scope of the applicability of the exemplary embodiment will become apparent from the detailed description provided below. It should be understood, however, that the detailed description and specific examples, while indicating preferred embodiments, are given by way of illustration only, since various changes and modifications within the spirit and scope of the exemplary embodiment will become apparent to those skilled in the art.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure will be set forth in the following detailed description of the disclosure when considered in conjunction with the drawings, in which.

DETAILED DESCRIPTION

Figure 1:
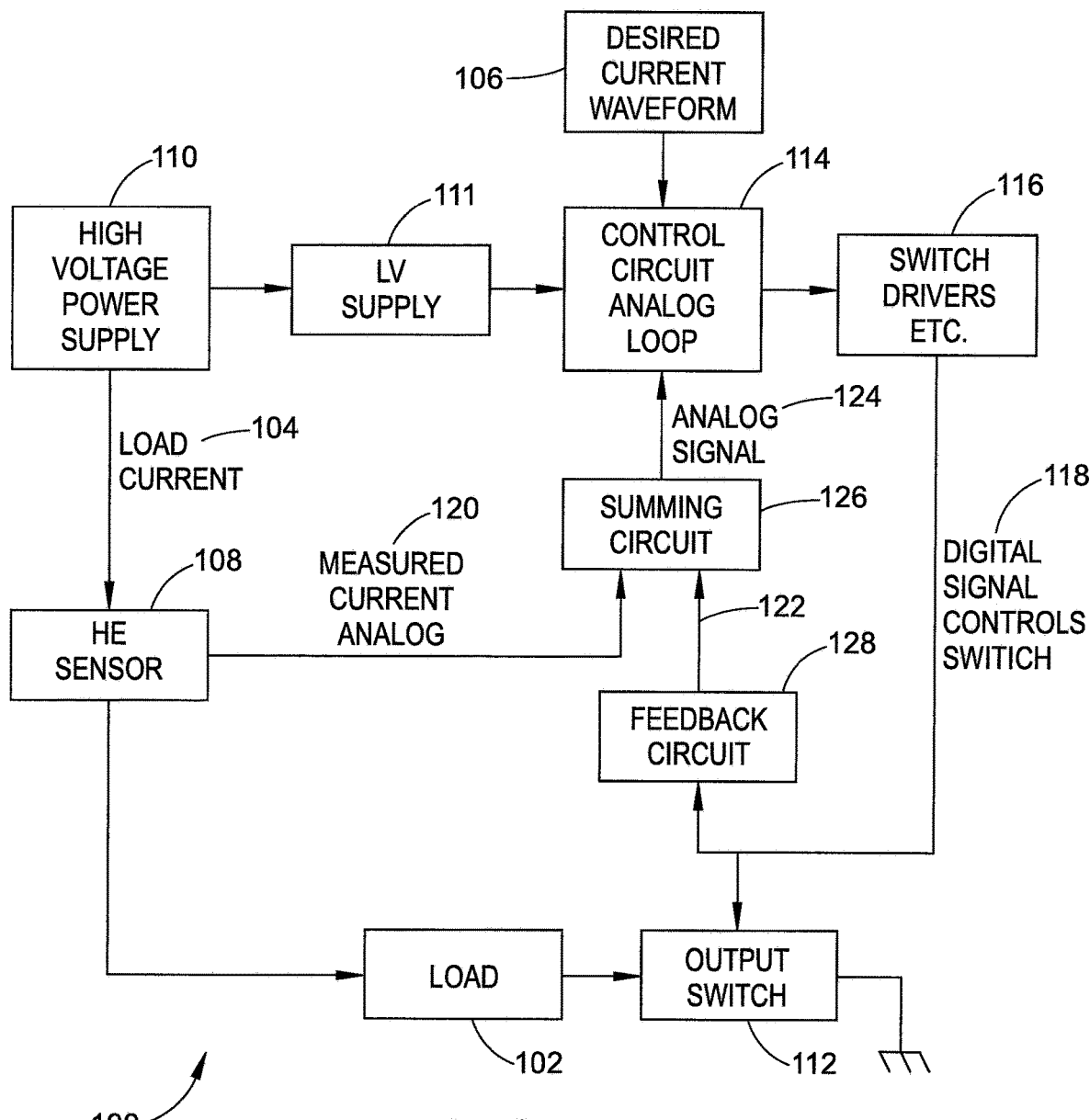
FIG. 1 is a schematic diagram of a system for closed loop control in accordance with aspects of the exemplary embodiment.

Referring now to the drawings wherein the showings are for purposes of illustrating the exemplary embodiments only and not for purposes of limiting the claimed subject matter, FIG. 1 is a schematic diagram of a system 100 for controlling current flow to an associated inductive load 102. It is well known that inductive loads resist changes in current and, as such, when measuring the current, it lags the voltage. In this example, the associated inductive load 102 is a solenoid valve. However, it is to be understood that the load can be any other type of electrical component that is inductive in nature. Non-limiting examples of such inductive loads include transformers, electric motors (fans, pumps, etc), solenoids, relays, and the like.

In a preferred embodiment, a drive current 104 to the load 102 is desired to follow a certain input signal waveform 106. The system 100 includes a current sensor 108. Due to the circuit configuration needed, a Hall effect current sensor, which has nearly ideal characteristics to measure the output current—with the exception of its output response time—is used. Thus, for example, when driving the low inductance solenoid 102 from a high voltage power supply (or voltage source) 110, the Hall effect sensor output cannot keep up with the change in the measured current.

More particularly, in this example, the Hall effect sensor 108 (a) has a given response rate, such as approximately 6 microseconds, (b) is used with the load 102, such as a solenoid valve having an inductance of less than 1 millihenry and a DC resistance of about 1 ohm, and (c) is driven from the voltage source 110 (e.g., around 200 volts). Optionally, this high input voltage may be converted to a low voltage 111 by the power supply. The system 100 also includes an output switching element (or output switch) 112. The output switching element 112 has an open state and a closed state and intermittently connects the power supply 110 to the inductive load 102 when the switching element 112 is in the closed state. When the output switching element 112 is initially turned ON, the inductance of the solenoid valve coil limits the rate of change for the current through the solenoid valve 102 to a given rate, for example, around 0.15 amps per microsecond (or 15 amps over 100 microseconds). When the set point value for the current is reached, a control circuit analog loop (or controller) 114 turns the switching element 112 OFF via at least one switch driver 116 and a digital signal 118. The slow response (e.g., 6 microseconds) of the Hall effect current sensor 108 causes a small overshoot error of, for example, 0.5 amps.

Further, when the output switching element 112 is turned OFF, the current declines rapidly, and the controller 114 turns the switching element 112 back ON. At this point, however, the rate of the current increase through the solenoid valve coil (di/dt) is much higher than the original rate, since the inductance of the coil is saturating. The current now increases at a rate of 5 amps over 5 microseconds, for example, and the current sensor output (or measured current analog signal) 120 does not change quickly enough for satisfactory control of the output switching element 112. This causes an overshoot current of 3 to 5 amps, for example. This situation only gets worse every time the switching element 112 needs to be turned OFF and then ON.

Since the rate of the current rise of the coil when the switching element 112 is ON is known, it is thus preferable to add a supplemental current signal 122 to the actual measured current signal 120 and thus create an artificial current signal 124 so as to force the control circuit 114 to respond more quickly than it could when based upon the measured current signal alone.

Preferably, the switch driver 116 generates a switch drive signal 118, which is provided to a control element (not shown) of the switch 112, which controls the state of the switch to be the opened state or the closed state based on a desired load current set point and a feedback signal. The Hall effect current sensor 108 measures the current flowing through the switching element 112 and the load 102 and a sensed current signal 120 is generated. A summing circuit 126 is configured to add a representation of the sensed current signal 120 and a supplemental signal comprising, for example, a representation of the switch drive signal 122 via a feedback circuit 128, so as to generate a combined feedback signal 124.

In other words, the exemplary system is used to drive, for example, an electromagnetic actuator, a solenoid, a relay, and/or a positioner. The controller is based upon a simple single point analog controller. The desired output current to the load is based upon an analog input voltage, which is time varying and used to profile the desired output current versus time. Hence, this is a closed loop analog control approach where the actual value of the ultimately controlled parameter, such as fuel flow, throttle position, supplied power, etc., is unknown to the control loop and only the measured current as compared to the desired current is known in this preferred embodiment.

Thus, in the exemplary embodiment, a supplemental current signal is added to the measured current signal when the switch is closed (based on the known rate of rise of the coil current) to compensate for the slow response time of the Hall effect sensor 108 and force the existing control circuit to open the switch sooner 118 than it would be based on the Hall-effect sensor signal alone.

In alternative embodiments, the supplemental signal could be adjusted relative to the output ON time; however, this is not required for proper operation of the basic concept. The supplemental signal is allowed to be applied for the first switch closure in embodiments, since the small offset against the larger slower changing current signal from the Hall effect sensor 108 causes only a very small error.

It is to be understood that the supplemental signal is generally a constant. However, in alternative embodiments, the supplemental signal can change over time over the course of a single switch closure. Furthermore, preventing the overshoot and avoiding undesired excessive current flow does not necessarily require a precise value of the signal.

An advantage of the exemplary embodiment is that no added measurement of a directly related parameter of the controlled parameter is needed, no calculations are required, and the better response advantage comes by means of knowledge of the output switch state alone.

Figure 2:
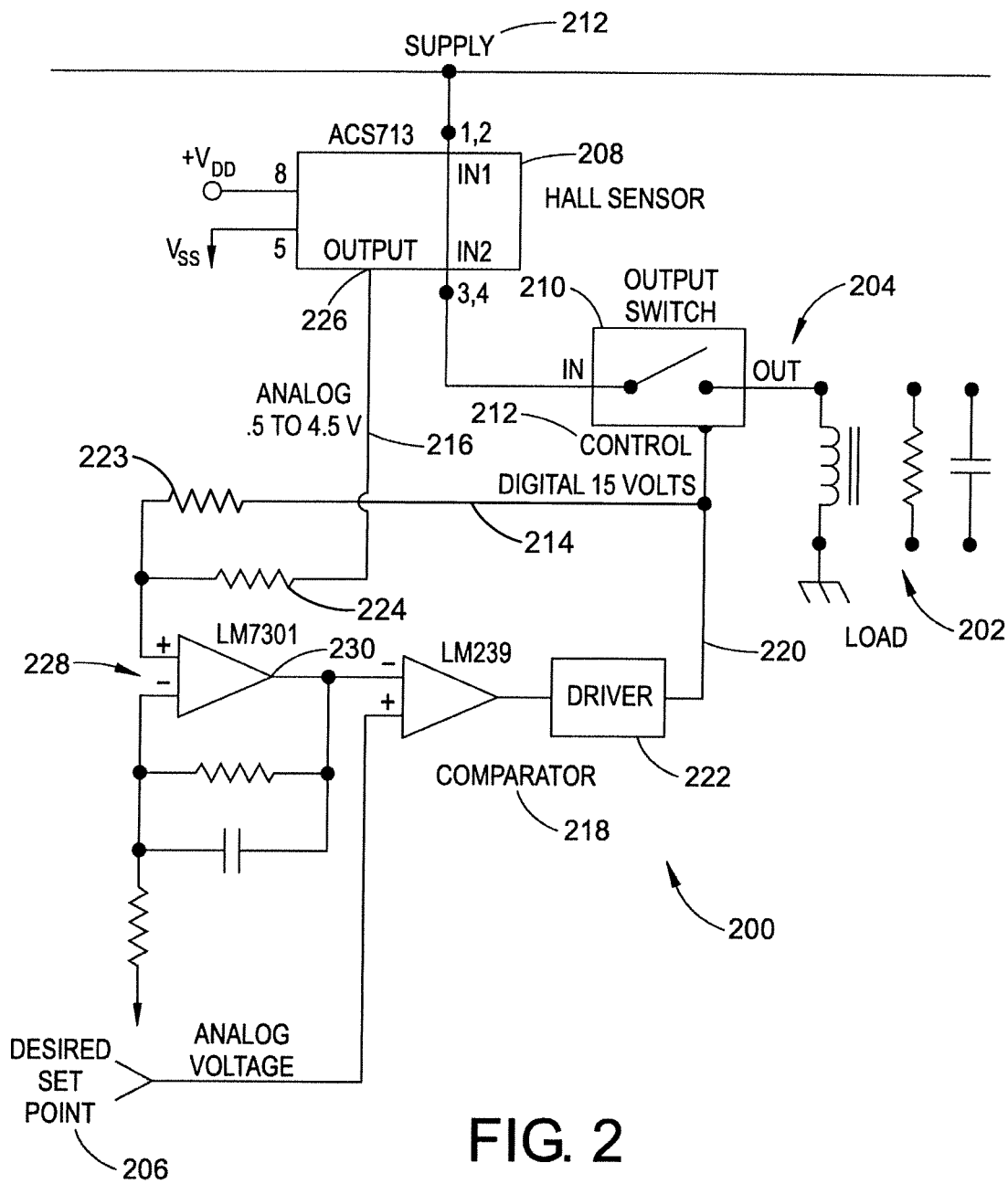
FIG. 2 is a circuit diagram of a system for closed loop control in accordance with aspects of the exemplary embodiment.

FIG. 2 is a circuit diagram of an exemplary system 200 for controlling current flow to an associated inductive load 202. In this example, the inductive load 202 is a solenoid valve, although other types of electrical components are contemplated. In this implementation, a drive current 204 to the load 202 is desired to follow a certain input signal waveform. A current sensor 208 is used to measure the current flowing through a switching element (or output switch) 210 and the load 202. For instance, the current sensor 208 is a Hall effect sensor. The switching element 210 has an open state and a closed state and intermittently connects the power supply 212 to the inductive load 202 when the switching element 210 is in the closed state. When the switching element 210 is initially turned ON, the inductance of the solenoid valve coil limits the rate of change for the current through the solenoid valve 202 to a given rate. When the set point value for the current is reached, a control circuit (or controller) 212 turns the switching element 210 OFF. The slow response of the current sensor 208 can cause an overshoot error. To address this, a supplemental signal 214 is added to the actual measured current signal 216 via an adder circuit such as, for example, operational amplifier 230, thus creating an feedback signal that is delivered to comparator 218. Comparator 218 compares the feedback signal to a desired current setpoint 206. The output of that comparator 218 is delivered as an input to switch driver 222, Based on that input, switch driver provides a control signal to switch control element 22. Adding the supplemental signal to the measured current signal tends to, for example, increase the value of the feedback thereby causing the to force the control circuit 200 to respond more quickly than it could when based upon the measured current signal alone. The Hall effect current sensor 208 measures the current flowing through the switching element 210 and the load 202 and a sensed current signal 226 is generated.

The measured signal of the Hall effect sensor 208 is generally a voltage of 0.5 to 4.5 volts representing 0 to 20 amperes of current flow in a preferred embodiment. The supplemental signal is generally a 0 or 15 volt signal, for example, which is connected through a series resistor 223 to a point where a small series resistor 224 is placed between the output 226 of the Hall effect sensor 208 and the input 228 to the amplifier 230. The two resistors acting as a voltage divider allow for a composite value of the voltage to be created at the input 228 of the amplifier 230. The weighted value of the supplemental circuit is generally less than 10% of the total.

It is to be understood that the 10% figure is a practical example but not a requirement. The ratio of the actual resistors used will determine the weighting (or percentage) of the speed up offset. Since the delayed response of the Hall effect sensor is an absolute amount of time, the desired offset value from the switch control state depends upon the actual circuit current rise time of the controlled load. The exact shape of the current rise is not necessarily important, rather, it is the value reached during the time that the sensor is lagging that matters. That is to say, for any given load circuit, the Hall effect, or other slow sensor, error can be measured and corrected for. In any given circuit embodiment, the offset from the control signal state can add the appropriate "current offset" to cancel out the overshoot, which would have occurred while waiting for the Hall effect sensor signal, for example, to ultimately reach the correct value.

By way of example, let us assume that the Hall effect sensor output takes about 5 microseconds to reach the full value of the actual measured current. If the desired set point is 10 amps and the current rises at an average rate of 0.10 amps per microsecond, then the sensor output will be at some value less than the actual current of 10 amps after 10 microseconds, say 8 amps or 80% of the actual current. The Hall effect measured signal generally has two components: 100% of the 5 amps more than 5 microseconds old and some part of the next 5 amp increase less than 5 microseconds old, say, for example, 3 amps. If the added signal based upon the output switch condition adds the equivalent of 2 amps, then this exactly cancels the delay error and the switch shuts off at the desired 10 amps through the load. The value of the feedback resistor can be selected to offset the error of any particular load circuit.

Figure 3:
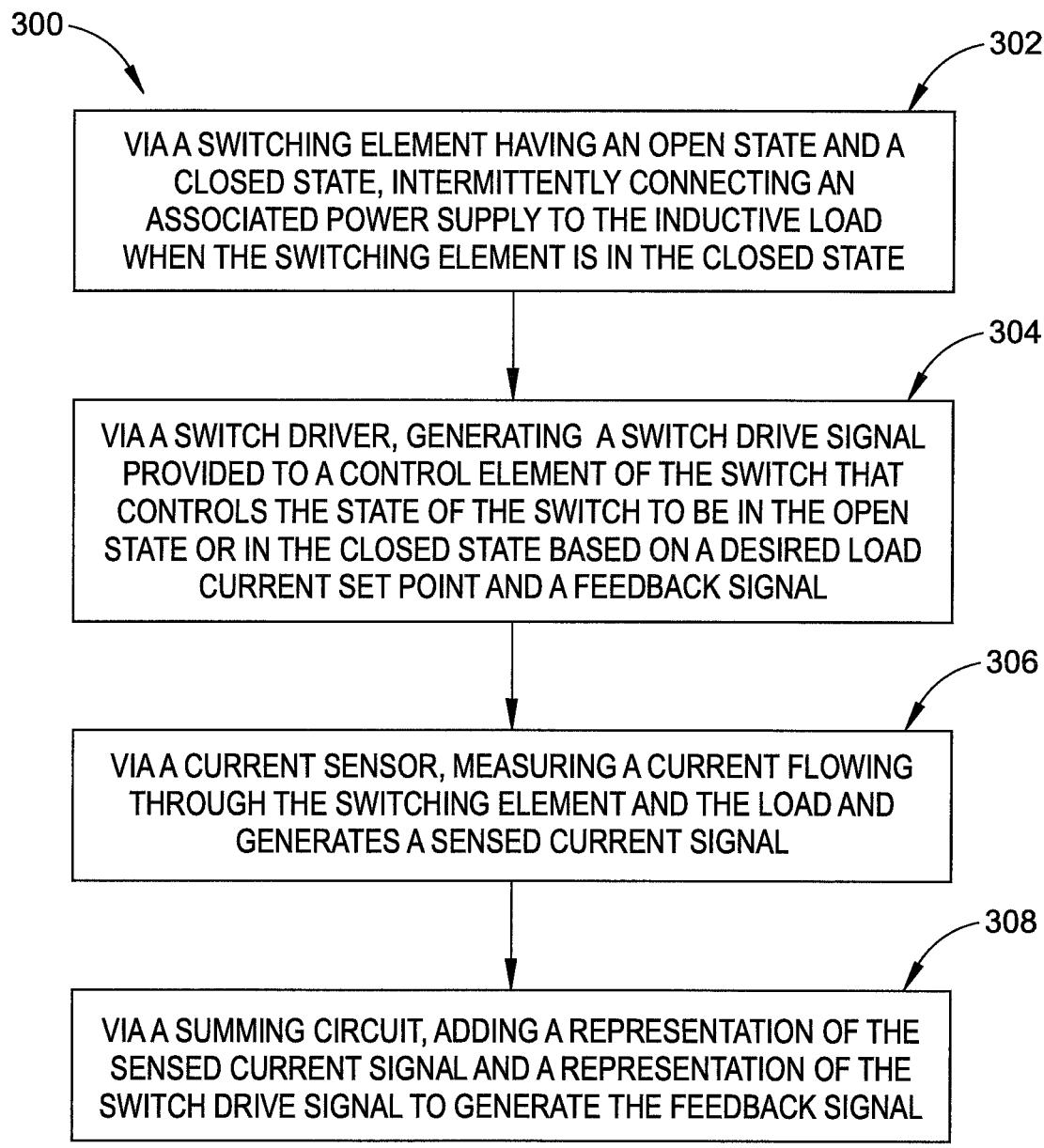
FIG. 3 is a flow chart of a method of closed loop control in accordance with aspects of the exemplary embodiment.

FIG. 3 illustrates a flowchart of an exemplary method 300 of controlling current flow to an associated inductive load. With reference to FIG. 1 as well, the method 300 includes, via a switching element having an open state and a closed state, such as the switch 112, intermittently connecting an associated power supply, such as the power supply 110, to an inductive load, such as the solenoid 102, when the switching element is in the closed state (step 302). Via a switch driver, such as the driver 116, a switch drive signal, such as the signal 118, is generated and provided to a control element of the switch that controls the state of the switch to be an open state or in a closed state based on a desired load current set point and a feedback signal (step 304). Via a current sensor, such as the hall effect sensor 108, a current flowing through the switching element and the load is measured and a sensed current signal is generated (step 306). Via a summing circuit, such as the summing circuit 126, a representation of the sensed current signal and a supplemental signal comprising a representation of the switch drive signal is added to generate the feedback signal (step 308).

The above description merely provides a disclosure of particular embodiments and is not intended for the purposes of limiting the same thereto. As such, the exemplary embodiment is not limited to only the above-described embodiments. Rather, it is recognized that one skilled in the art could conceive alternative embodiments that fall within the scope of the exemplary embodiment.

The invention claimed is:

1. A circuit for controlling current flow to an associated inductive load, the circuit comprising:
    a switching element having an open state and a closed state that is configured to intermittently connect an associated power supply to the associated inductive load when the switching element is in the closed state;
    a switch driver that generates a switch drive signal provided to a control element of the switching element, the switch drive signal being configured to control the state of the switching element to be in the open state or in the closed state based on a desired load current set point and a feedback signal;
    a current sensor configured to measure a current flowing through the switching element and the associated inductive load and generate, from the measured flowing current, a sensed current signal representing a present current sensor reading; and
    a summing circuit that adds the sensed current signal and a supplemental signal comprising a representation of the present switch drive signal to generate the feedback signal.

2. The circuit for controlling current flow of claim 1, wherein the supplemental signal is adjusted relative to an output ON time.

3. The circuit for controlling current flow of claim 1, wherein the supplemental signal is a substantially constant value whenever the switch drive signal is a substantially constant value.

4. The circuit for controlling current flow of claim 1, wherein the supplemental signal changes over time during a period in which the switching element remains closed.

5. The circuit for controlling current flow of claim 1, wherein the associated inductive load comprises a solenoid valve.

6. The circuit for controlling current flow of claim 1, wherein the current sensor comprises a Hall effect sensor.

7. The circuit for controlling current flow of claim 6, wherein the associated inductive load comprises a solenoid valve.

8. A method of controlling current flow to an associated inductive load, the method comprising:
    via a switching element having an open state and a closed state, intermittently connecting an associated power supply to the associated inductive load when the switching element is in the closed state;
    via a switch driver, generating a switch drive signal provided to a control element of the switching element, the switch drive signal being configured to control the state of the switching element to be in the open state or in the closed state based on a desired load current set point and a feedback signal;

via a current sensor, measuring a current flowing through the switching element and the associated inductive load and generating, from the measured flowing current, a sensed current signal representing a present current sensor reading;

via a summing circuit, adding the sensed current signal and a representation of the present switch drive signal to generate the feedback signal.

9. The method of claim 8, wherein the representation of the present switch drive signal is adjusted relative to an output ON time.

10. The method of claim 8, wherein the representation of the present switch drive signal is a substantially constant value whenever the switch drive signal is a substantially constant value.

11. The method of claim 8, wherein the representation of the present switch drive signal changes over time during a period in which the switching element remains closed.

12. The method of claim 8, wherein the associated inductive load comprises a solenoid valve.

13. The method of claim 8, wherein the current sensor comprises a Hall effect sensor.

14. The method of claim 13, wherein the associated inductive load comprises a solenoid valve.

15. An analog circuit tar controlling current flow to an associated load, the analog circuit comprising: a switching element having an open state and a closed state that is configured to intermittently connect an associated power supply to the associated load when the switching element is in the dosed state; a switch driver that generates a switch drive signal provided to a control element of the switching element, the switch drive signal being configured to control the state of the switching dement to be in the open state or in the dosed state based on a desired load current set point and a feedback signal; a current sensor configured to measure a current flowing through the switching element and the associated bad and generate, from the measured flowing current, an analog sensed current signal representing a present current sensor reading; and an analog summing circuit that adds the analog sensed current signal and a supplemental signal comprising a representation of the present switch drive signal to generate the feedback signal.

16. A circuit for controlling current flow to an associated inductive load, the circuit comprising:

a switching element having an open state and a closed state that is configured to intermittently connect an associated power supply to the associated inductive load when the switching element is in the closed state;

a switch driver that generates a substantially binary (high/low) switch drive signal provided to a control element of the switching element, the switch drive signal being configured to control the state of the switching element to be in the open state (off) or in the closed state (on) based on a desired load current set point and a feedback signal;

a current sensor configured to measure a current flowing through the switching element and the associated inductive load and generate, from the measured flowing current, a sensed current signal representing a present current sensor reading; and a summing circuit that adds the sensed current signal and a supplemental signal comprising a scaled version of the present state of the substantially binary (high/low) switch drive signal to generate the feedback signal.

* * * * *